United States Patent
Kim

(10) Patent No.: US 12,077,063 B2
(45) Date of Patent: Sep. 3, 2024

(54) APPARATUS FOR DETECTING MALFUNCTION AND METHOD THEREFOR

(71) Applicant: LG INNOTEK CO., LTD., Seoul (KR)

(72) Inventor: Hyoung Dong Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 500 days.

(21) Appl. No.: 17/424,822

(22) PCT Filed: Jan. 21, 2020

(86) PCT No.: PCT/KR2020/000997
§ 371 (c)(1),
(2) Date: Jul. 21, 2021

(87) PCT Pub. No.: WO2020/153702
PCT Pub. Date: Jul. 30, 2020

(65) Prior Publication Data
US 2022/0024344 A1  Jan. 27, 2022

(30) Foreign Application Priority Data
Jan. 21, 2019 (KR) .................. 10-2019-0007615

(51) Int. Cl.
*B60L 58/12* (2019.01)
*G01R 31/28* (2006.01)
(Continued)

(52) U.S. Cl.
CPC .......... *B60L 58/12* (2019.02); *G01R 31/2836* (2013.01); *G01R 31/3646* (2019.01);
(Continued)

(58) Field of Classification Search
None
See application file for complete search history.

(56) References Cited

U.S. PATENT DOCUMENTS

| 2009/0021364 A1 | 1/2009 | Frey et al. |
| 2012/0133282 A1 | 5/2012 | Rubio et al. |

(Continued)

FOREIGN PATENT DOCUMENTS

| CN | 103809117 A | 5/2014 |
| JP | 55-9146 A | 1/1980 |

(Continued)

OTHER PUBLICATIONS

Office Action dated Aug. 8, 2023 in Chinese Application No. 202080010197.0.

(Continued)

*Primary Examiner* — Roy Y Yi
(74) *Attorney, Agent, or Firm* — Saliwanchik, Lloyd & Eisenschenk

(57) ABSTRACT

Provided is an apparatus for detecting malfunction, the apparatus detecting malfunction of a display device for displaying a charging state of a vehicle battery according to a control signal. The apparatus for detecting malfunction according to an embodiment of the present invention comprises: an interrupt generation unit for generating an interrupt signal if the control signal satisfies a preset event; a voltage detection unit for detecting a voltage value of the control signal by converting an analog value of the control signal into a digital value; and a determination unit for detecting at least one among whether or not the display device has malfunction and a malfunction type on the basis of at least one among whether or not the display device operates, whether or not the interrupt signal is generated, and the voltage value of the control signal.

18 Claims, 6 Drawing Sheets

(51) Int. Cl.
*G01R 31/36* (2020.01)
*G01R 31/3835* (2019.01)
*G01R 31/52* (2020.01)
*G01R 31/54* (2020.01)

(52) U.S. Cl.
CPC ......... *G01R 31/3835* (2019.01); *G01R 31/52* (2020.01); *G01R 31/54* (2020.01); *B60Y 2200/91* (2013.01)

(56) References Cited

U.S. PATENT DOCUMENTS

| 2014/0265555 | A1 | 9/2014 | Hall et al. | |
|---|---|---|---|---|
| 2020/0324664 | A1* | 10/2020 | Kanzaki | B60L 58/12 |
| 2021/0116256 | A1* | 4/2021 | Konrardy | B60W 60/001 |

FOREIGN PATENT DOCUMENTS

| JP | 57-211902 A | 12/1982 |
|---|---|---|
| JP | 2008-232978 A | 10/2008 |
| JP | 5832620 B1 | 12/2015 |
| JP | 2016-14558 A | 1/2016 |
| JP | 2016-80532 A | 5/2016 |
| JP | 2019-78619 A | 5/2019 |
| KR | 10-1127040 B1 | 3/2012 |
| KR | 10-2015-0036075 A | 4/2015 |
| KR | 10-1594895 B1 | 2/2016 |
| KR | 10-2016-0121639 A | 10/2016 |

OTHER PUBLICATIONS

Supplementary European Search Report dated Sep. 19, 2022 in European Application No. 20745465.3.
Office Action dated Aug. 2, 2022 in Japanese Application No. 2021-542455.
International Search Report dated Apr. 24, 2020 in International Application No. PCT/KR2020/000997.

* cited by examiner

APPARATUS FOR DETECTING MALFUNCTION AND METHOD THEREFOR

CROSS-REFERENCE TO RELATED APPLICATIONS

This application is the U.S. national stage application of International Patent Application No. PCT/KR2020/000997, filed Jan. 21, 2020, which claims the benefit under 35 U.S.C. § 119 of Korean Application No. 10-2019-0007615, filed Jan. 21, 2019, the disclosures of each of which are incorporated herein by reference in their entirety.

TECHNICAL FIELD

An embodiment relates to an apparatus for detecting a malfunction and a method thereof.

BACKGROUND ART

An eco-friendly vehicle, such as an electric vehicle (EV) or a plug-in hybrid electric vehicle (PHEV), uses electric vehicle supply equipment (EVSE) installed at a charging station to charge a battery.

To this end, an electric vehicle charging controller (EVCC) is mounted in the EV, communicates with the EV and EVSE, and controls charging of the electric vehicle.

For example, when the EVCC receives a signal which instructs charging start from the electric vehicle, the EVCC may perform control to start charging, and when receiving a signal which instructs charging end from the electric vehicle, the EVCC may perform control to end charging.

A method of charging the electric vehicle can be classified into fast charging and slow charging according to a charging time. In the case of the fast charging, a battery is charged by a direct current (DC) supplied from a charger, and in the case of the slow charging, the battery is charged by an alternating current (AC) supplied to a charger. Accordingly, the charger used for the fast charging is referred to as a fast charger or a DC charger, and the charger used for the slow charging is referred to as a slow charger or an AC charger.

Meanwhile, since the electric vehicle is charged with a high voltage and a high current, demand for safety during charging is increasing. To this end, a light emitting diode (LED) display device which displays the charging state is installed at a charging port of the electric vehicle, and a user checks the charging state through the LED display device of the charging port. However, there is a problem in that a malfunction of the LED display device cannot be detected, and a cause of the malfunction cannot be known even when the user recognizes the malfunction.

DISCLOSURE

Technical Problem

An embodiment relates to an apparatus for detecting a malfunction which detects whether an indicator which displays a charging state of an electric vehicle malfunctions and a malfunction type, and a method of detecting the malfunction using the same.

The problem to be solved in the embodiment is not limited thereto, and purposes and effects understood from the solutions and embodiments which will be described below are also included.

Technical Solution

One aspect of the present invention provides an apparatus for detecting a malfunction, configured to detect a malfunction of an indicator configured to display a charging state of a vehicle battery according to a control signal, the apparatus including: an interrupt generation unit configured to generate an interrupt signal when the control signal satisfies a preset predetermined event; a voltage detection unit configured to convert an analog value of the control signal to a digital value to detect a voltage value of the control signal; and a determination unit configured to determine at least one among whether the indicator malfunctions and a malfunction type on the basis of at least one among whether the indicator operates, whether the interrupt signal is generated, and the voltage value of the control signal.

The determination unit may determine whether the indicator malfunctions and the malfunction type according to whether the interrupt signal is generated and the voltage value of the control signal when it is determined that the indicator operates.

The determination unit may determine that the indicator normally operates when the interrupt signal is generated, and the voltage value of the control signal is included in a range larger than a first threshold value and smaller than a second threshold value larger than the first threshold value, and may determine that a malfunction occurs in the indicator when the interrupt signal is generated, and the voltage value of the control signal is not included in the range larger than the first threshold value and smaller than the second threshold value.

The determination unit may determine the malfunction type of the indicator as a short to ground when the interrupt signal is generated and the voltage value of the control signal is smaller than or equal to the first threshold value, and may determine the malfunction type of the indicator as a cable open when the voltage value of the control signal is larger than or equal to the second threshold value.

The determination unit may determine that the malfunction occurs in the indicator when the interrupt signal is not generated.

The determination unit may determine the malfunction type of the indicator as a short to ground when the voltage value of the control signal is smaller than or equal to a third threshold value, and may determine the malfunction type of the indicator as a short to battery when the voltage value of the control signal is larger than the third threshold value.

The determination unit may determine whether the indicator malfunctions and the malfunction type according to the voltage value of the control signal when it is determined that the indicator does not operate.

The determination unit may determine that the indicator is in a normal state when the voltage value of the control signal is smaller than or equal to a fourth threshold value, and may determine the malfunction type of the indicator as a short to battery when the voltage value of the control signal is larger than the fourth threshold value.

Another aspect of the present invention provides a method of detecting a malfunction using an apparatus for detecting a malfunction configured to detect a malfunction of an indicator configured to display a charging state of a vehicle battery according to a control signal, the method including: an operation of generating an interrupt signal when the control signal satisfies a preset predetermined event; an operation of converting an analog value of the control signal to a digital value to detect a voltage value of the control signal; and an operation of determining at least one among whether the indicator malfunctions and a malfunction type on the basis of at least one among whether the indicator operates, whether the interrupt signal is generated, and the voltage value of the control signal.

The operation of determining at least one among whether the indicator malfunctions and the malfunction type may include an operation of determining whether the indicator operates, an operation of determining at least one among whether the indicator malfunctions and the malfunction type on the basis of at least one among whether the interrupt signal is generated and the voltage value of the control signal when it is determined that the indicator operates and the interrupt signal is generated, and an operation of determining at least one among whether the indicator malfunctions and the malfunction type on the basis of the voltage value of the control signal when it is determined that the indicator does not operate.

Advantageous Effects

There is an advantage in that whether an indicator malfunctions and a malfunction type can be conveniently detected through an analysis of a control signal of the indicator even when separate hardware for detecting a malfunction according to an embodiment of the present invention is not installed.

Various useful advantages and effects of the present invention are not limited to the above and can be relatively easily understood in a process of describing exemplary embodiments of the present invention.

MODES OF THE INVENTION

Hereinafter, preferred embodiments of the present invention will be described in detail with reference to the accompanying drawings.

However, the technical spirit of the present invention is not limited to some embodiments to be described and may be embodied in various forms, and one or more elements in the embodiments may be selectively combined and replaced to be used within the scope of the technical spirit of the present invention.

Further, terms used in the embodiments of the present invention (including technical and scientific terms), may be interpreted with meanings that are generally understood by those skilled in the art unless particularly defined and described, and terms which are generally used, such as terms defined in a dictionary, may be understood in consideration of their contextual meanings in the related art.

In addition, terms used in the description are provided not to limit the present invention but to describe the embodiments.

In the specification, the singular form may also include the plural form unless the context clearly indicates otherwise and may include one or more of all possible combinations of A, B, and C when disclosed as "at least one (or one or more) of A, B, and C."

Further, terms such as first, second, A, B, (a), (b), and the like may be used to describe elements of the embodiments of the present invention.

The terms are only provided to distinguish an element from other elements, and the essence, sequence, order, or the like of the elements are not limited by the terms.

Further, when particular elements are disclosed as being "connected," "coupled," or "linked" to other elements, the elements may include not only a case of being directly connected, coupled, or linked to other elements but also a case of being connected, coupled, or linked to other elements by elements between the elements and other elements.

In addition, when one element is disclosed as being formed "on or under" another element, the term "on or under" includes both a case in which the two elements are in direct contact with each other and a case in which at least another element is disposed between the two elements (indirectly). Further, when the term "on or under" is expressed, a meaning of not only an upward direction but also a downward direction may be included based on one element.

Figure 1:
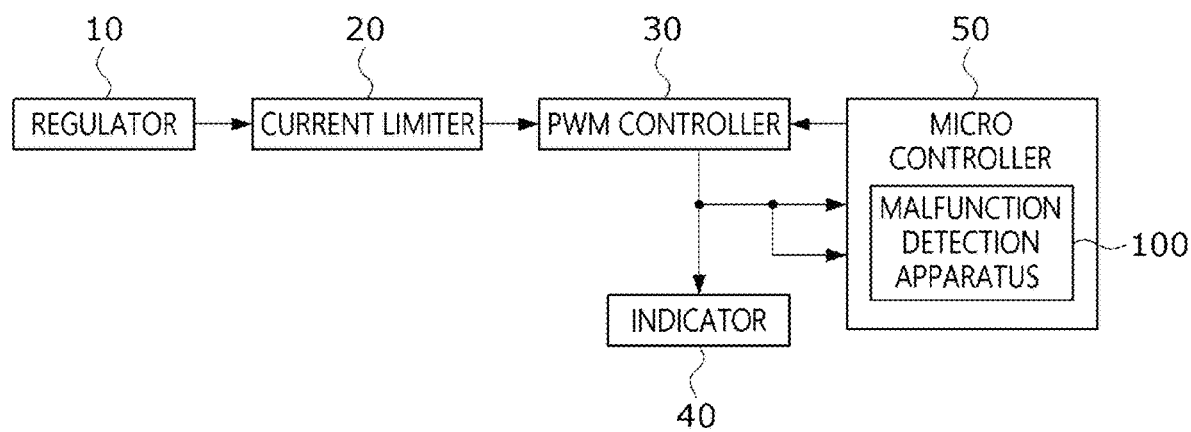
FIG. 1 is a view illustrating a malfunction detection system using an apparatus for detecting a malfunction according to an embodiment of the present invention.

FIG. 1 is a view illustrating a malfunction detection system using an apparatus for detecting a malfunction according to an embodiment of the present invention.

An electric vehicle requires a diagnostic trouble code (DTC) in order to diagnose a malfunction of components constituting the vehicle. The malfunction detection system according to the embodiment of the present invention may detect information for determining a malfunction code in order to detect a malfunction state of an indicator 40 which shows a charging state of an electric vehicle battery when charging the electric vehicle.

Referring to FIG. 1, the malfunction detection system according to the embodiment of the present invention may include a regulator 10, a current limiter 20, a pulse width modulation (PWM) controller 30, the indicator 40, and a microcontroller 50.

The regulator 10 may be a device which stabilizes a voltage. The regulator 10 may control an input direct current (DC) voltage so that the DC voltage may be stably output. For example, the regulator 10 may stabilize and output a DC voltage received from a converter to a DC voltage of 12 V.

The current limiter 20 may be a device that blocks the flow of current when the current according to the DC voltage input from the regulator 10 is larger than or equal to a preset level. The current limiter 20 is disposed between the regulator 10 and the PWM controller 30, and may control so that the output voltage of the regulator 10 is not input to the PWM controller 30 by blocking the flow of current when the current according to the DC voltage input from the regulator 10 is larger than or equal to a preset level. For example, when the current according to the DC voltage of 12 V input from the regulator 10 exceeds 20 mA, the current may be blocked. Accordingly, there is an advantage in that the PWM controller 30 may be protected from overcurrent.

The PWM controller 30 may generate a control signal input to the indicator 40. The control signal may be a control signal according to a pulse width modulation method. The PWM controller 30 may generate the control signal based on the DC voltage output from the regulator 10 and a control command output from the microcontroller 50. The PWM control signal generated by the PWM controller 30 may have the same magnitude as the DC voltage output from the regulator 10. For example, when the regulator 10 outputs a DC voltage of 12 V, the PWM controller 30 may generate a control signal of 12 V.

The indicator 40 may display the charging state of the vehicle battery according to the control signal output from the PWM controller 30. The indicator 40 may display any one of an uncharged state, a charging state, and a ready-to-charge state of the vehicle battery. The uncharged state, the charging state, and the ready-to-charge state are examples of charging states of the vehicle battery, and the indicator 40 may display various charging states in addition thereto. According to the embodiment of the present invention, the indicator 40 may be disposed at a charging port of the electric vehicle. The indicator 40 may be implemented through a light emitting diode (LED) element.

The microcontroller (micro controller unit) 50 may generate the control command and transmit the control command to the PWM controller 30. In this case, the control command may be a PWM type signal having a voltage level of 5 V. The microcontroller 50 may receive the control signal transmitted from the PWM controller 30 to the indicator 40. The microcontroller 50 may receive a control signal through two input terminals. The control signal input through a first input terminal among the two input terminals may be used to detect a voltage value, and the control signal input through a second input terminal among the two input terminals may be used to generate an interrupt signal. The first input terminal may be an analog-to-digital converter (ADC) port, and the second input terminal may be an interrupt port. The ADC port may be constantly awake, and the interrupt port may wake up at a predetermined period.

As shown in FIG. 1, the microcontroller 50 may include an apparatus for detecting a malfunction (a malfunction detection apparatus) 100 according to the embodiment of the present invention. The malfunction detection apparatus 100 may be an algorithm implemented through the microcontroller 50, but is not limited thereto. The malfunction detection apparatus 100 may determine at least one of whether the indicator 40 malfunctions and a malfunction type by analyzing the control signal transmitted from the PWM controller 30 to the indicator 40. Detailed configurations of the malfunction detection apparatus 100 will be described later in detail with reference to the drawings.

Figure 2:
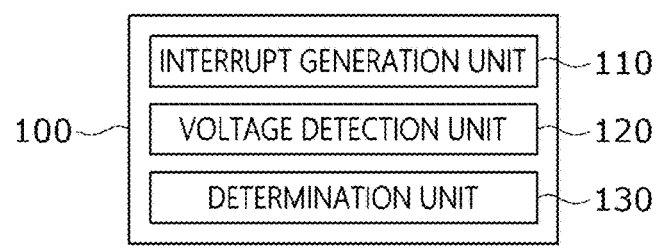
FIG. 2 is a configuration diagram of the apparatus for detecting a malfunction according to the embodiment of the present invention.

FIG. 2 is a configuration diagram of the apparatus for detecting a malfunction according to the embodiment of the present invention.

Referring to FIG. 2, the malfunction detection apparatus 100 according to the embodiment of the present invention may include an interrupt generation unit 110, a voltage detection unit 120, and a determination unit 130.

The interrupt generation unit 110 may generate an interrupt signal when a control signal satisfies a preset predetermined event. A control signal input to the interrupt generation unit may be a control signal input through the second input terminal of the microcontroller 50, that is, an interrupt port. The interrupt generation unit 110 may generate an interrupt signal according to a predetermined event such as whether a voltage value of the control signal is changed, whether there is a rising edge, whether there is a falling edge, or the like. For example, the interrupt generation unit 110 may generate an interrupt signal when an event in which the falling edge is detected in the control signal occurs.

The voltage detection unit 120 may detect the voltage value of the control signal by converting an analog value of the control signal to a digital value. The control signal input to the voltage detection unit 120 may be a control signal input through the first input terminal of the microcontroller 50, that is, the ADC port. The voltage detection unit 120 may convert the control signal, which is an analog signal, to a digital signal through a sequence such as sampling, quantization, and coding. The voltage detection unit 120 may detect a voltage value of the control signal by monitoring the control signal converted to the digital signal.

The determination unit 130 may determine at least one of whether the indicator 40 malfunctions and the malfunction type on the basis of at least one of whether the indicator 40 operates, whether the interrupt signal is generated, and the voltage value of the control signal. In this case, whether the indicator 40 operates may be input from the microcontroller 50. For example, the determination unit 130 may receive a trigger signal for whether the indicator 40 operates from the microcontroller 50. On the other hand, whether the indicator 40 operates may be determined on the basis of the control command input to the PWM controller 30 by the microcontroller 50. For example, the determination unit 130 may analyze the control command input to the PWM controller 30 to determine whether the indicator 40 operates.

According to the embodiment of the present invention, the determination unit 130 may include three sequences which determine whether the indicator 40 malfunctions and the malfunction type on the basis of whether the indicator 40 operates, whether the interrupt signal is generated, and the voltage value of the control signal.

A first sequence may refer to a process of the determination unit 130 which determines whether the indicator 40 malfunctions and the malfunction type by comparing the voltage value of the control signal with a preset threshold value when the indicator 40 operates and the interrupt signal is generated.

A second sequence may refer to a process of the determination unit 130 which determines whether the indicator 40 malfunctions and the malfunction type by comparing the voltage value of the control signal with the preset threshold value when the indicator 40 operates and the interrupt signal is not generated.

A third sequence may refer to a process of the determination unit 130 which determines whether the indicator 40 malfunctions and the malfunction type by comparing the voltage value of the control signal with the preset threshold value when the indicator 40 does not operate.

Two threshold values (a first threshold value and a second threshold value) may be used in the first sequence, and one threshold value (a third threshold value and a fourth threshold value) may be used in each of the second sequence and the third sequence. In this case, the first threshold value, the third threshold value, and the fourth threshold value may be set to the same value. The second threshold value may be set to a value larger than the first threshold value.

Each sequence of the determination unit 130 will be described later in detail with reference to the drawings.

Figure 3:
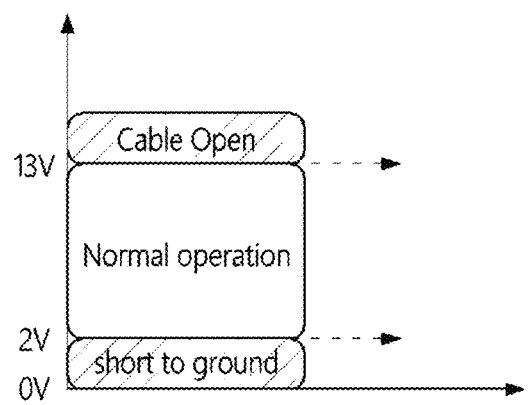
FIG. 3 is a view for describing a first embodiment of a determination unit according to the embodiment of the present invention.

FIG. 3 is a view for describing a first embodiment of the determination unit according to the embodiment of the present invention.

FIG. 3 illustrates a process in which the determination unit 130 determines whether the indicator 40 malfunctions and the malfunction type according to the first sequence.

The first sequence may be performed when the indicator 40 operates and the interrupt signal is generated. The determination unit 130 may determine whether the indicator 40 malfunctions and the malfunction type according to whether the interrupt signal is generated and the voltage value of the control signal when it is determined that the indicator 40 operates.

Specifically, when the interrupt signal is generated and the voltage value of the control signal is included in a range larger than the first threshold value and smaller than the second threshold value, the determination unit 130 may determine that the indicator 40 normally operates.

However, when the interrupt signal is generated and the voltage value of the control signal is not included in the range larger than the first threshold value and smaller than the second threshold value, the determination unit 130 may determine that the malfunction has occurred in the indicator 40.

When it is determined that the malfunction occurs, the determination unit 130 may determine the malfunction type of the indicator 40. Specifically, the determination unit 130 may determine the malfunction type of the indicator 40 as a short to ground when the interrupt signal is generated and the voltage value of the control signal is smaller than or equal to the first threshold value, and may determine the malfunction type of the indicator 40 as a cable open when the voltage value of the control signal is larger than or equal to the second threshold value.

FIG. 3 illustrates a case in which the first threshold value is set to 2 V, and the second threshold value is set to 13 V. When the voltage value of the control signal is between 2 V and 13 V, the determination unit 130 may determine that the indicator 40 normally operates. When the voltage value of the control signal is in a range smaller than or equal to 2 V, the determination unit 130 may determine that the malfunction has occurred in the indicator 40 due to the short to ground. When the voltage value of the control signal is in a range larger than or equal to 13 V, the determination unit 130 may determine that the malfunction has occurred in the indicator 40 due to the cable open.

Figure 4:
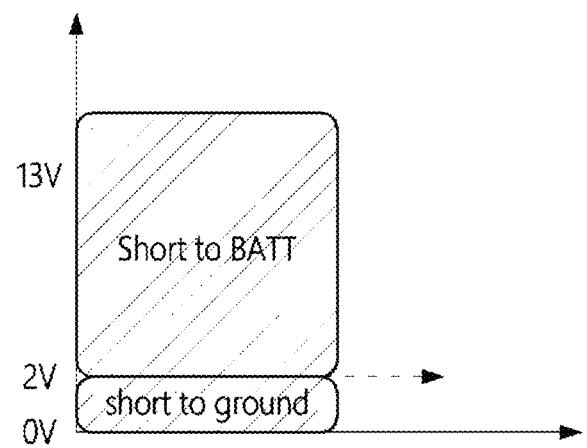
FIG. 4 is a view for describing a second embodiment of the determination unit according to the embodiment of the present invention.

FIG. 4 is a view for describing a second embodiment of the determination unit according to the embodiment of the present invention.

FIG. 4 illustrates a process in which the determination unit 130 determines whether the indicator 40 malfunctions and the malfunction type according to the second sequence.

The second sequence may be performed when the indicator 40 operates and the interrupt signal is not generated. The determination unit 130 may determine that the malfunction has occurred in the indicator 40 when the interrupt signal is not generated while the indicator 40 operates.

When it is determined that the malfunction occurs, the determination unit 130 may determine the malfunction type of the indicator 40 as the short to ground when the voltage value of the control signal is smaller than or equal to the third threshold value, and may determine the malfunction type of the indicator 40 as a short to battery when the voltage value of the control signal is larger than the third threshold value.

FIG. 4 illustrates a case in which the third threshold value is set to 2 V. When the voltage value of the control signal is in a range smaller than or equal to 2 V, the determination unit 130 may determine that the malfunction has occurred in the indicator 40 due to the short to ground. When the voltage value of the control signal is in a range larger than 2 V, the determination unit 130 may determine that the malfunction has occurred in the indicator 40 due to the short to battery (short to BATT).

Figure 5:
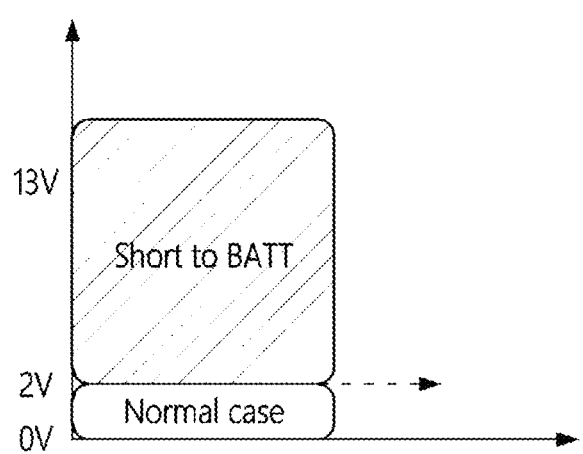
FIG. 5 is a view for describing a third embodiment of the determination unit according to the embodiment of the present invention.

FIG. 5 is a view for describing a third embodiment of the determination unit according to the embodiment of the present invention.

FIG. 5 illustrates a process in which the determination unit 130 determines whether the indicator 40 malfunctions and the malfunction type according to the third sequence.

The third sequence may be performed when the indicator 40 does not operate. The determination unit 130 may determine whether the indicator 40 malfunctions and the malfunction type on the basis of the voltage value of the control signal without considering the interrupt signal.

The determination unit 130 may determine that the indicator 40 is in a normal state when the voltage value of the control signal is smaller than or equal to a fourth threshold value, and may determine the malfunction type of the indicator 40 as the short to battery when the voltage value of the control signal is larger than the fourth threshold value.

FIG. 5 illustrates a case in which the fourth threshold value is set to 2 V. When the voltage value of the control signal is in a range smaller than or equal to 2 V, the determination unit 130 may determine that the indicator 40 is in the normal state. When the voltage value of the control signal is in a range larger than 2 V, the determination unit 130 may determine that the malfunction has occurred in the indicator 40 due to the short to battery (short to BATT).

Figure 6:
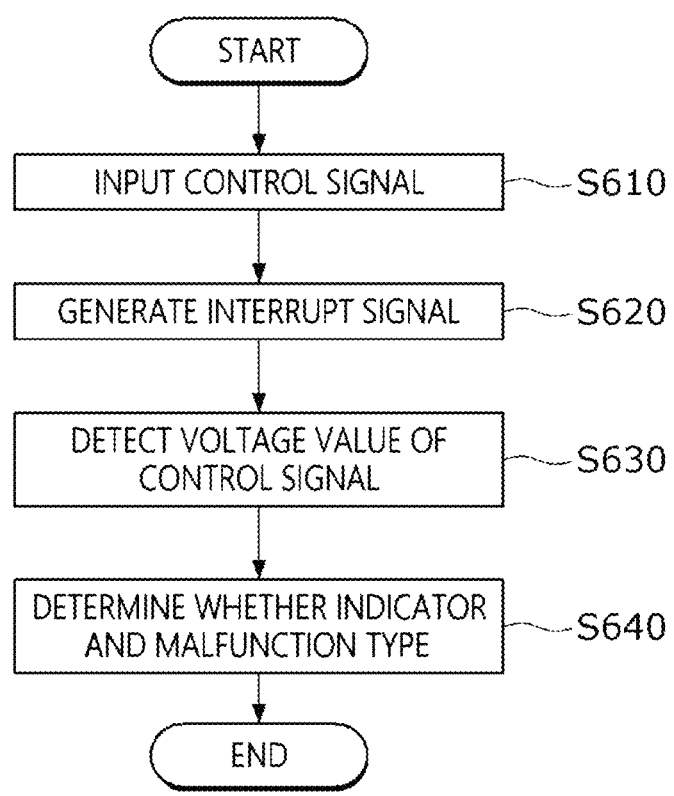
FIG. 6 is a flow chart of a method of detecting a malfunction according to the embodiment of the present invention.

FIG. 6 is a flow chart of a method of detecting a malfunction according to the embodiment of the present invention.

Referring to FIG. 6, the method of detecting a malfunction using the malfunction detection apparatus 100 according to the embodiment of the present invention may include operations S610, S620, S630, and S640.

First, the malfunction detection apparatus 100 may receive a control signal (S610). In this case, the control signal may refer to a control signal transmitted to the indicator 40 from the PWM controller 30.

The interrupt generation unit 110 of the malfunction detection apparatus 100 may generate an interrupt signal when the control signal satisfies a preset predetermined event (S620).

The voltage detection unit 120 of the malfunction detection apparatus 100 may detect a voltage value of the control signal by converting an analog value of the control signal to a digital value (S630).

The determination unit 130 of the malfunction detection apparatus 100 may determine at least one of whether the indicator 40 malfunctions and the malfunction type on the basis of at least one of whether the indicator 40 operates, whether the interrupt signal is generated, and the voltage value of the control signal (S640).

Figure 7:
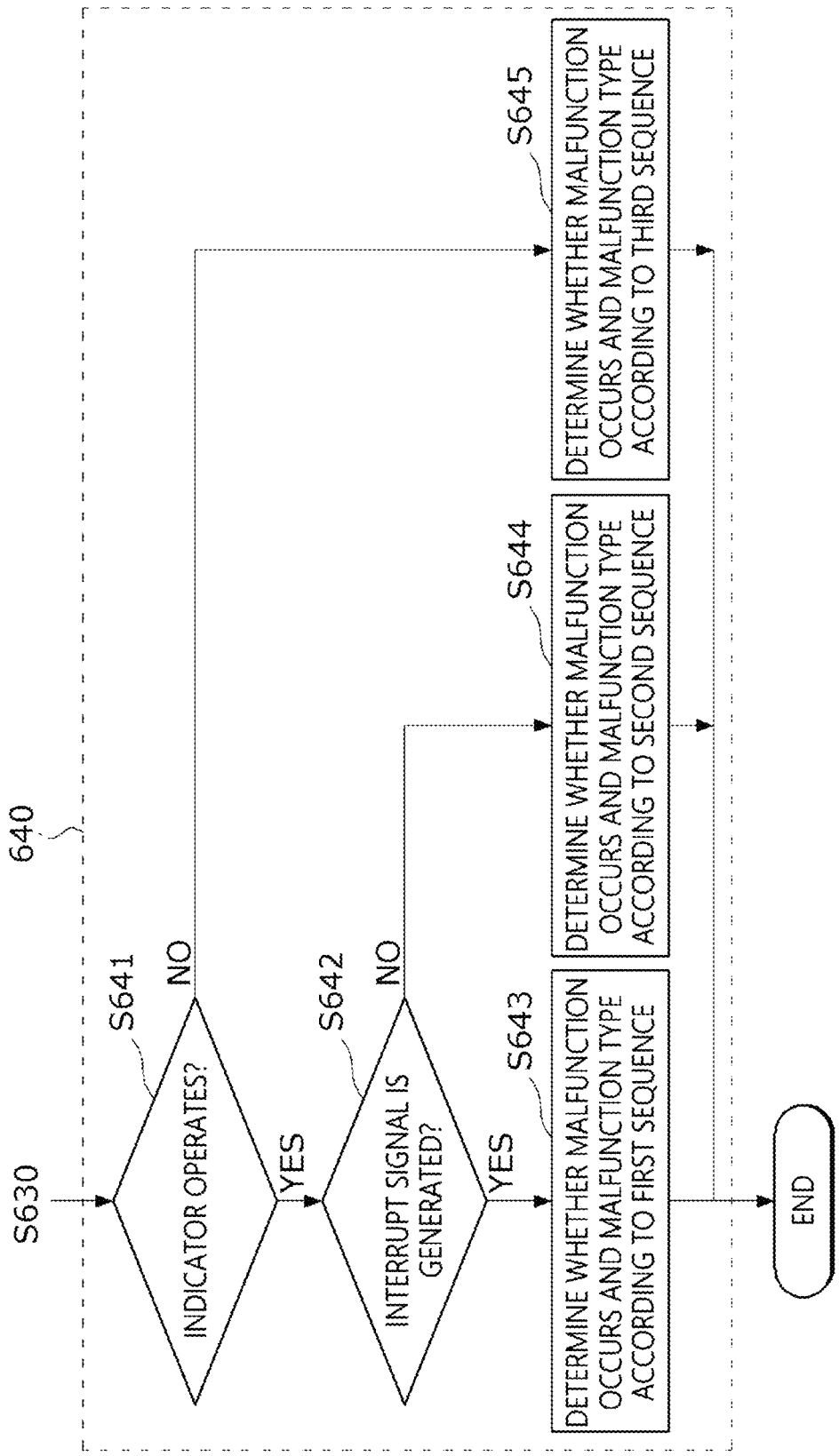
FIG. 7 is a flow chart illustrating operation S640 in FIG. 6 in detail.

FIG. 7 is a flow chart illustrating operation S640 in FIG. 6 in detail.

Referring to FIG. 7, operation S640 in FIG. 6 may include operations S641 to S645.

First, the determination unit 130 may determine whether the indicator 40 operates (S641).

The determination unit 130 may determine whether the interrupt signal is generated when it is determined that the indicator 40 operates (S642).

The determination unit 130 may determine whether the indicator 40 malfunctions and the malfunction type according to the first sequence when it is determined that the interrupt signal is generated (S643).

On the other hand, the determination unit 130 may determine whether the indicator 40 malfunctions and the malfunction type according to the second sequence when it is determined that the interrupt signal is not generated (S644).

The determination unit 130 may determine whether the indicator 40 malfunctions and the malfunction type according to the third sequence without considering whether the interrupt signal is generated when it is determined that the indicator 40 does not operate (S645).

Figure 8:
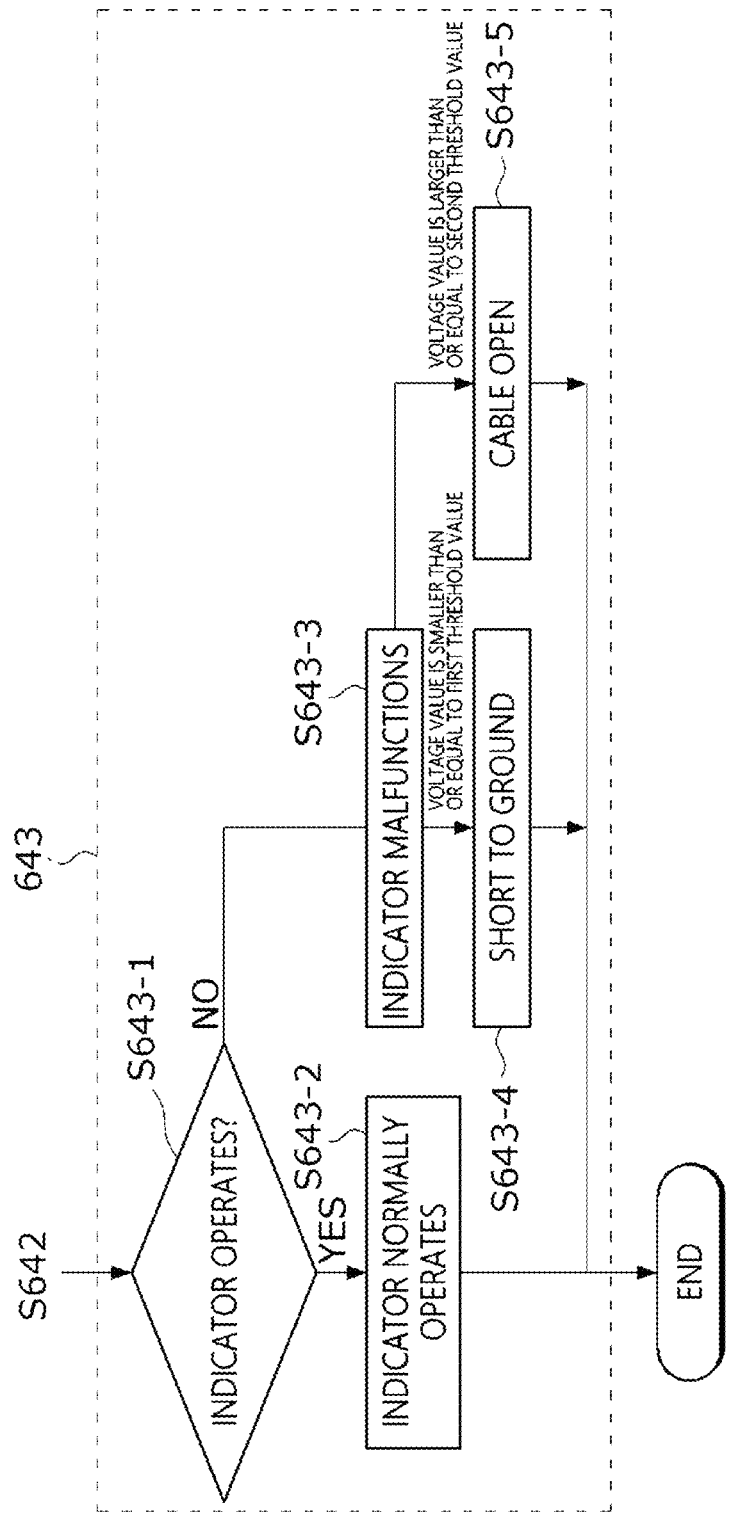
FIG. 8 is a flow chart illustrating operation S643 in FIG. 7 in detail.

FIG. 8 is a flow chart illustrating operation S643 in FIG. 7 in detail.

Referring to FIG. 8, operation S643 in FIG. 7 may include operations S643-1 to S643-5.

First, the determination unit 130 may determine whether the voltage value of the control signal is included between the first threshold value and the second threshold value (S643-1).

The determination unit 130 may determine that the indicator 40 normally operates when it is determined that the voltage value of the control signal is included between the first threshold value and the second threshold value (S643-2).

On the other hand, the determination unit 130 may determine that the indicator 40 malfunctions when it is determined that the voltage value of the control signal is not included between the first threshold value and the second threshold value (S643-3).

In this case, the determination unit 130 may determine that the malfunction type of the indicator 40 is the short to ground when the voltage value of the control signal is smaller than or equal to the first threshold value (S643-4).

Further, the determination unit 130 may determine that the malfunction type of the indicator 40 is the cable open when the voltage value of the control signal is larger than or equal to the second threshold value (S643-5).

Figure 9:
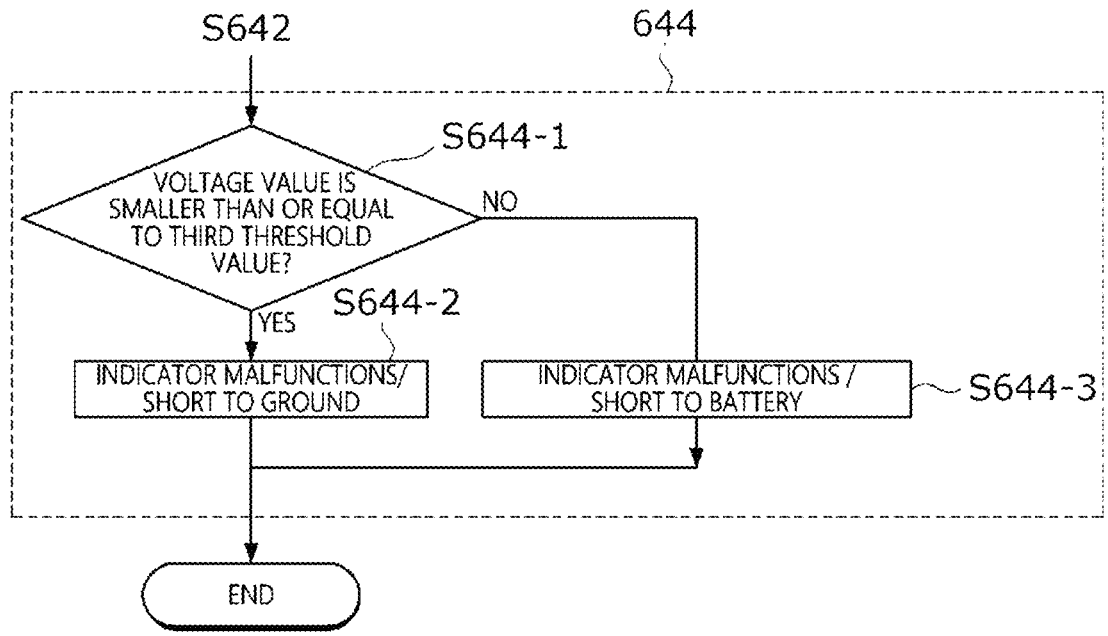
FIG. 9 is a flow chart illustrating operation S644 in FIG. 7 in detail.

FIG. 9 is a flow chart illustrating operation S644 in FIG. 7 in detail.

Referring to FIG. 9, operation S644 in FIG. 7 may include operations S644-1 to S644-3.

First, the determination unit 130 may determine whether the voltage value of the control signal is smaller than or equal to the third threshold value (S644-1).

The determination unit 130 may determine that the malfunction has occurred in the indicator 40 and the malfunction type is the short to ground when the voltage value of the control signal is smaller than or equal to the third threshold value (S644-2).

On the other hand, the determination unit 130 may determine that the malfunction has occurred in the indicator 40 and the malfunction type is the short to battery when the voltage value of the control signal is larger the third threshold value (S644-3).

Figure 10:
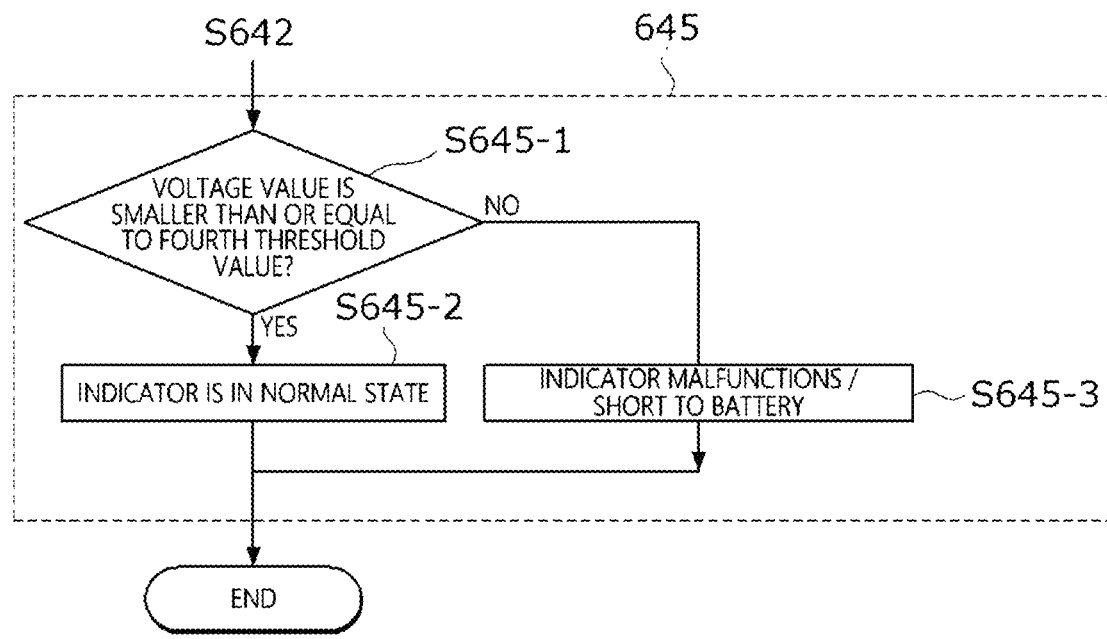
FIG. 10 is a flow chart illustrating operation S645 in FIG. 7 in detail.

FIG. 10 is a flow chart illustrating operation S645 in FIG. 7 in detail.

Referring to FIG. 10, operation S645 in FIG. 7 may include operations S645-1 to S645-3.

First, the determination unit 130 may determine whether the voltage value of the control signal is smaller than or equal to the fourth threshold value (S645-1).

The determination unit 130 may determine that the indicator 40 is in the normal state when the voltage value of the control signal is smaller than or equal to the fourth threshold value (S645-2).

On the other hand, the determination unit 130 may determine that the malfunction has occurred in the indicator 40 and the malfunction type is the short to battery when the voltage value of the control signal is larger than the fourth threshold value (S644-3).

There is an advantage in that whether the indicator malfunctions and the malfunction type can be conveniently detected through an analysis of the control signal of the indicator even when separate hardware for detecting a malfunction according to the embodiment of the present invention is not installed.

The term '~ unit' used in the embodiment refers to a software component or hardware component such as a field-programmable gate array (FPGA) or an application-specific integrated circuit (ASIC), and the '~ unit' performs certain roles. However, the '~ unit' is not limited to the software or hardware. The '~ unit' may be configured to be in an addressable storage medium, or may be configured to run one or more processors. Accordingly, as an example, the '~ unit' includes components such as software components, object-oriented software components, class components, and task components, processes, functions, properties, procedures, subroutines, segments of program code, drivers, firmware, microcode, circuits, data, databases, data structures, tables, arrays, and variables. The components and functions provided in the '~ units' may be combined into a smaller number of elements and '~ units', or may be further separated into additional elements and '~ units.' Further, the components and the '~ units' may be implemented to run one or more central processing units (CPUs) in a device or a security multimedia card.

Although the above is mainly described with reference to the embodiments of the present invention, the above is only exemplary, and it should be understood that those skilled in the art may variously perform modifications and applications within the principle of the embodiments. For example, elements specifically shown in the embodiments may be modified. Further, differences related to modifications and changes should be understood as being included in the scope of the present invention defined in the appended claims.

The invention claimed is:

1. An apparatus for detecting a malfunction configured to detect a malfunction of an indicator configured to display a charging state of a vehicle battery according to a control signal, the apparatus comprising:
   an interrupt generation unit configured to generate an interrupt signal when the control signal satisfies a preset predetermined event;
   a voltage detection unit configured to convert an analog value of the control signal to a digital value to detect a voltage value of the control signal; and
   a determination unit configured to determine at least one among whether a malfunction occurrence is indicated by the indicator and a malfunction type based on at least one among whether the indicator operates, whether the interrupt signal is generated, and the voltage value of the control signal,
   wherein the determination unit is configured to determine whether a malfunction occurrence is indicated by the indicator when the interrupt signal is not generated while the indicator operates.

2. The apparatus of claim 1, wherein the determination unit determines whether a malfunction occurrence is indicated by the indicator and the malfunction type according to the voltage value of the control signal when it is determined that the indicator operates and the interrupt signal is generated.

3. The apparatus of claim 2, wherein the determination unit is configured to determine whether the indicator normally operates when the interrupt signal is generated, and the voltage value of the control signal is in a range larger than a first threshold value and smaller than a second threshold value that is larger than the first threshold value, and that a malfunction occurrence is indicated by the indicator when the interrupt signal is generated, and the voltage value of the control signal is not in the range larger than the first threshold value and smaller than the second threshold value.

4. The apparatus of claim 3, wherein the determination unit is configured to determine whether the malfunction type of the indicator indicates a short to ground when the interrupt signal is generated and the voltage value of the control signal is smaller than or equal to the first threshold value, and determines the malfunction type of the indicator as a cable open when the voltage value of the control signal is larger than or equal to the second threshold value.

5. The apparatus of claim 1, wherein the determination unit is configured to determine whether the malfunction type of the indicator indicates a short to ground when the voltage value of the control signal is smaller than or equal to a third threshold value, and that the malfunction type of the indicator indicates a short to battery when the voltage value of the control signal is larger than the third threshold value.

6. The apparatus of claim 1, wherein the determination unit is configured to determine whether a malfunction occurrence is indicated by the indicator and the malfunction type according to the voltage value of the control signal when it is determined that the indicator does not operate.

7. The apparatus of claim 6, wherein the determination unit is configured to determine that the indicator is in a normal state when the voltage value of the control signal is smaller than or equal to a fourth threshold value.

8. A method of detecting a malfunction using an apparatus for detecting a malfunction configured to detect a malfunction of an indicator configured to display a charging state of a vehicle battery according to a control signal, the method comprising:
generating an interrupt signal when the control signal satisfies a preset predetermined condition;
converting an analog value of the control signal to a digital value to detect a voltage value of the control signal; and
determining at least one among whether the indicator malfunctions and a malfunction type based on at least one among whether the indicator operates, whether the interrupt signal is generated, and the voltage value of the control signal,
wherein the determining at least one among whether a malfunction occurrence is indicated by the indicator and the malfunction type includes:
determining whether the indicator operates; and
determining whether a malfunction occurrence is indicated by the indicator when the interrupt signal is not generated while the indicator operates.

9. The method of claim 8, wherein the determining at least one among whether a malfunction occurrence is indicated by the indicator and the malfunction type includes determining whether the indicator operates, and determining whether the interrupt signal is generated according to the determination result of whether the indicator operates to determine at least one among whether a malfunction occurrence is indicated by the indicator and the malfunction type.

10. The apparatus of claim 1, wherein the determination unit is configured to determine whether the indicator operates, and whether the interrupt signal is generated according to the determination result of whether the indicator operates to determine at least one among whether a malfunction occurrence is indicated by the indicator and the malfunction type.

11. The apparatus of claim 7, wherein the determination unit is configured to determine whether the malfunction type of the indicator indicates a short to battery when the voltage value of the control signal is larger than the fourth threshold value.

12. The method of claim 9, wherein the determining at least one among whether a malfunction occurrence is indicated by the indicator and the malfunction type includes determining whether a malfunction occurrence is indicated by the indicator and the malfunction type according to whether the interrupt signal is generated and the voltage value of the control signal when it is determined that the indicator operates.

13. The method of claim 12, wherein the determining at least one among whether a malfunction occurrence is indicated by the indicator and the malfunction type includes determining whether the indicator normally operates when the interrupt signal is generated, and whether the voltage value of the control signal is in a range larger than a first threshold value and smaller than a second threshold value that is larger than the first threshold value, and determining whether a malfunction occurrence is indicated by the indicator when the interrupt signal is generated, and whether the voltage value of the control signal is not in the range larger than the first threshold value and smaller than the second threshold value.

14. The method of claim 13, wherein the determining at least one among whether a malfunction occurrence is indicated by the indicator and the malfunction type includes determining whether the malfunction type of the indicator as indicates a short to ground when the interrupt signal is generated and whether the voltage value of the control signal is smaller than or equal to the first threshold value, and determining whether the malfunction type of the indicator indicates a cable open when the voltage value of the control signal is larger than or equal to the second threshold value.

15. The method of claim 8, wherein the determining at least one among whether a malfunction occurrence is indicated by the indicator and the malfunction type includes determining whether the malfunction type of the indicator indicates a short to ground when the voltage value of the control signal is smaller than or equal to a third threshold value, and whether the malfunction type of the indicator indicates a short to battery when the voltage value of the control signal is larger than the third threshold value.

16. The method of claim 8, wherein the determining at least one among whether a malfunction occurrence is indicated by the indicator and the malfunction type includes determining whether the indicator malfunctions and the malfunction type according to the voltage value of the control signal when it is determined that the indicator does not operate.

17. The method of claim 16, wherein the determining at least one among whether a malfunction occurrence is indicated by the indicator and the malfunction type includes determining whether the indicator is in a normal state when the voltage value of the control signal is smaller than or equal to a fourth threshold value.

18. The method of claim 17, wherein the determining at least one among whether a malfunction occurrence is indicated by the indicator and the malfunction type includes determining whether the malfunction type of the indicator indicates a short to battery when the voltage value of the control signal is larger than the fourth threshold value.

* * * * *